United States Patent [19]

Prigent et al.

[11] Patent Number: 4,464,621
[45] Date of Patent: Aug. 7, 1984

[54] TEST DEVICE FOR AND METHOD OF LOCATING FAULTS IN A TWO-WIRE LINE OR FOR SWITCHING TWO-WIRE LINES

[76] Inventors: Hubert Prigent, Bat. N 401 Kerhuel; Maurice Roudeau, Rés. de la Commanderie; Michel Daniel, Ar Leslac'h, all of Lannion, France, 22300

[21] Appl. No.: 365,962

[22] Filed: Apr. 6, 1982

[30] Foreign Application Priority Data

Apr. 17, 1981 [FR] France .................. 81 07783

[51] Int. Cl.³ .................................. G01R 31/02
[52] U.S. Cl. ............................ 324/52; 324/51
[58] Field of Search ............ 324/52, 51; 361/93; 179/175.3 F, 175.25

[56] References Cited

U.S. PATENT DOCUMENTS 3,553,571 1/1971 Fendt et al. ................ 324/52
4,110,683 8/1978 Cason et al. ................ 324/52

FOREIGN PATENT DOCUMENTS 0759438 8/1954 Fed. Rep. of Germany ........ 324/52
2099595 12/1982 United Kingdom ................ 324/52

Primary Examiner—Stanley T. Krawczewicz
Attorney, Agent, or Firm—Lowe, King, Price & Becker

[57] ABSTRACT

A test device detects current in a two-wire line, such as a telephone loop, to enable a short circuit or the like to be determined at a remote location. The current at a predetermined line location is sensed by a simple switch means. Switching of the line, such as a working line, is controlled with another two-wire line, such as a spare line. Control is provided to select one of two loads terminating the line. The test device is connected in series on one of the line wires. The test device has a constant ohmic value in a low current range when the in-line current is less than a predetermined current value. The ohmic value increases sharply to a higher value in a high current range when the in-line current is greater than the predetermined current value. The test device comprises a relay having an operate coil and a resting contact which are series-connected between the terminals of the test device, and a resistor connected in parallel with the contact.

24 Claims, 8 Drawing Figures

FIG.1
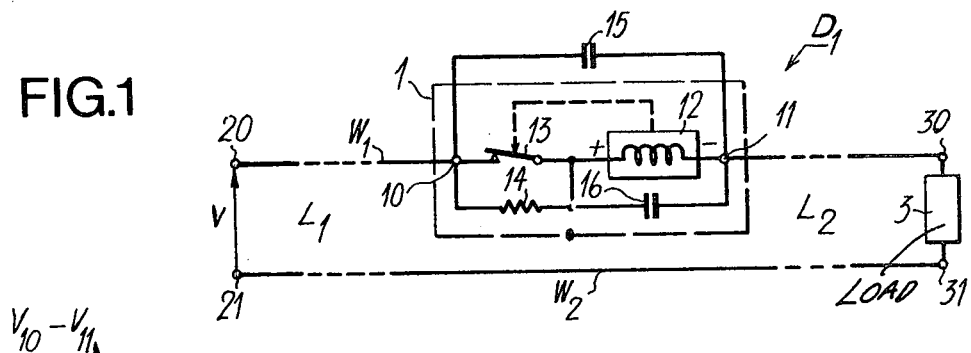
FIG.2
FIG.3
FIG.4
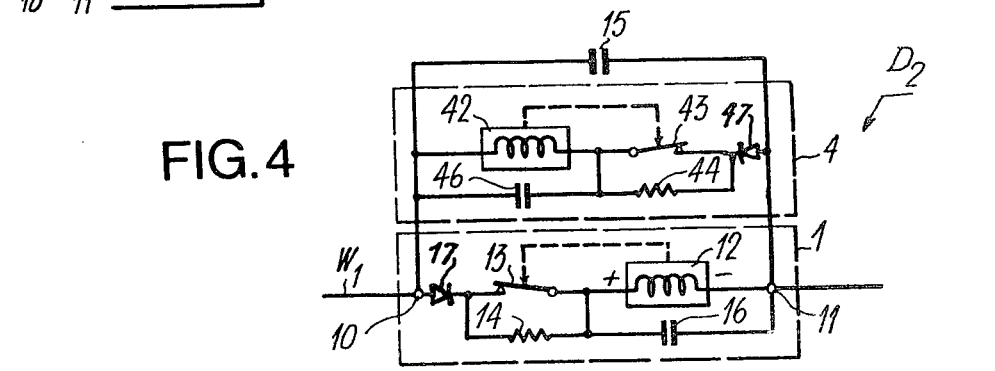
FIG.5
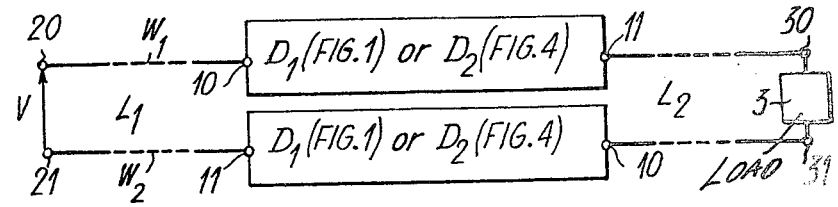

TEST DEVICE FOR AND METHOD OF LOCATING FAULTS IN A TWO-WIRE LINE OR FOR SWITCHING TWO-WIRE LINES

BACKGROUND OF THE INVENTION

1. Field of the Invention

The present invention relates to a test device for locating faults in a two-wire line. The test device is based on detecting in-line current and consequently enables a short circuit, an insulation fault or a low resistance shunt to determine at a remote location. Generally speaking, the invention deals with sensing the current along an electrical two-wire line at a predetermined location to locate a resistive loop in the line or to control switching of the line at that location with another two-wire line or to select one of two loads terminating the line.

Reference is made hereinafter to the particular case in which the two-wire line is a telephone subscriber loop serving a telephone subscriber terminal from a switching facility at the associated telephone exchange.

2. Description of the Prior Art

The prior test devices for locating faults in a telephone subscriber line are costly and work in a rudimentary fashion. The test device disconnects the remainder of the line at the telephone terminal end and loops the line at the location in question to perform remote continuity and/or insulation testing measurements using a testing and measuring apparatus available in the associated switching facility. The measurements confirm whether the detected fault is located in a line on the switching facility side or telephone terminal side and aid in deciding whether (1) a maintenance team equipped with heavy-duty gear should be sent to repair the line or (2) a subscriber should call in a specialist to repair his telephone terminal. After a given period of time, the test device returns to its original position.

A recent development in telephone subscriber installations or analogous telephone terminals, as well as in testing and measuring apparatus, enables the current flowing through the line at a predetermined location to be more accurately measured. This location may coincide with an input of a telephone terminal or a line-to-exchange frame junction. Furthermore, this development permits remote controlled switching, where necessary, from the telephone exchange. This application is especially advantageous when substituting a spare two-wire line for a faulty working line.

OBJECT OF THE INVENTION

The main object of this invention is therefore to provide a straight-forward and inexpensive test device allowing the value of current flowing in a two-wire line to be sensed with a view to locating a resistive or non-resistive loop or, upon adding simple switch means, selecting one of two line loads or substituting a spare line for the working one.

SUMMARY OF THE INVENTION

In accordance with the above object, there is provided a test device for locating faults in a two-wire line comprising a first dipole which is series connected on one of the line wires. The dipole has a constant ohmic value in a low-current range when the in-line current is less than a predetermined value. The dipole ohmic value increases sharply to a higher magnitude in a high-current range when the in-line current is greater than the predetermined value.

In a preferred embodiment, the first dipole comprises a relay having an energizing or operate coil and a resting contact; the coil and contact are series connected between the terminals of the first dipole on the line wire and a resistor connected in parallel with the contact.

The relay preferably includes a conventional flexible blade switch to reduce the cost of the test device. In this case, the test device comprises a second dipole identical to the first dipole. A terminal of each of the first and second dipoles is series connected to a diode. The polarities of the two dipoles are opposed thus entirely doing away with any determined polarity on the line terminals at the testing and measuring apparatus end, which may be a source for error when the apparatus is initially installed.

The test device may comprise a capacitor that is connected in parallel between the terminals of the test device, and/or a capacitor that is connected in parallel with the operate coil of the relay in each dipole. Such a capacitor makes the test device transparent to alternating or impulsing currents.

According to another aspect of this invention, a second analogous test device is series connected on the other wire of the two-wire line to locate resistive or non-resistive loops from said wire down to ground. This invention also provides a test system for locating faults at various locations on the two-wire line. The test system comprises a plurality of test devices which are connected at predetermined locations along the line. The test devices have different predetermined current values corresponding to switch-overs in the test device relays. The current values increase as distance increases from the line input at the testing and measuring apparatus and switching facility towards the load at the other line end. These test devices thus enable very precise location of a fault between two test devices and hence obviate tests along the whole line length.

A test device series connected on one of the line wires is controlled to select one of two line loads. The test device controls a switching device comprising a bistable relay having an operate coil connected in parallel between the terminals of the test device. The relay includes two switch means respectively connected in series with the two line wires and controlled by the bistable relay. One of the stationary contacts of each of the switch means is connected to one terminal of one of the loads while the other stationary contact of each of switch means is connected to one of the terminals of the other load.

A switching device of a test device is series connected on a wire of a line acting as a spare line that is to be replaced by a working line that is looped across a load. The switching device comprises a bistable relay having an operate coil connected in parallel between the terminals of the test device; the bistable relay controls first, second and third switch means. The first switch means is analogous to a resting contact and is connected between the terminals of the spare line wires. One of the stationary contacts of each of second and third switches is connected to one of the terminals of the spare line wires. Other stationary contacts of the second and third switch means are connected to terminals of the working line wires. The moving contacts of the second and third switch means are selectively connected to the load terminals via a working two-wire line section.

BRIEF DESCRIPTION OF THE DRAWING

Further features and advantages of the invention will be apparent from the following more particular description of preferred embodiments of the invention as illustrated in the accompanying drawings in which:

FIG. 1 is a circuit diagram of a test device including a dipole for locating a resistive loop in a two-wire line;

FIG. 2 is a diagram of the voltage-current characteristic of the dipole;

FIG. 3 is a diagram of the voltage and current variations peculiar to changed conditions in the dipole;

FIG. 4 is a circuit diagram of a test device including two oppositely-poled dipoles as per the invention;

FIG. 5 is a block diagram of a test device including two elementary test devices series respectively connected to two wires of a line as per the invention;

DESCRIPTION OF THE PREFERRED EMBODIMENTS

Figure 6:
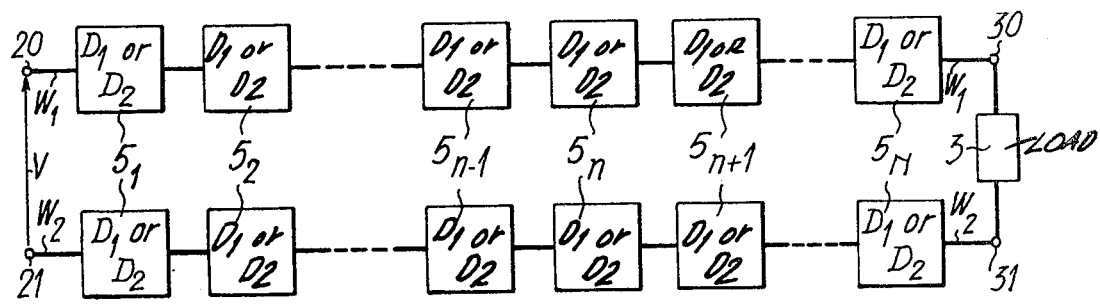
FIG. 6 is a block diagram of a test system including a plurality of test devices connected in series in a two-wire line as per the invention.

Depicted in FIG. 1 is the basic structure of the current sensing test device $D_1$ embodying the invention. Test device $D_1$ is a dipole 1 having two terminals 10 and 11. Connected in series between the terminals of the dipole are the operate coil 12 of a relay, a normally closed contact 13 of the relay connected in parallel with contact 13 is resistor 14. Contact 13 shunts resistor 14 when the current flowing through coil 12 is less than a predetermined threshold current with a value of $I_T$ that deactivates the relay. Contact 13 is open when the current flowing through coil 12 is greater than $I_T$.

The characteristic of the voltage ($V_{10}$–$V_{11}$) at terminals 10 and 11 of the dipole 1 in terms of the dipole current I is shown in FIG. 2. This characteristic can be divided into two ranges, one on either side of the predetermined current value $I_T$ that corresponds to the activation or change of condition of relay 12, i.e. to the opening of contact 13. A low current range is defined by $I<I_T$ and corresponds to a very low resistance of dipole 1 which is close to zero and which is equal to the very low impedance of the coil 12.

A second higher current range is defined for $I \geq I_T$ and corresponds to a resistance of dipole 1 decidedly higher than that for the first range. The dipole resistance for the high range current is equal to the sum of the impedances of resistor 14 and coil 12, once resting contact 13 has opened. Dipole 1 thus behaves as a variable resistor which varies as a function of the current I flowing through it.

In FIG. 1, dipole 1 is connected in series with one of the wires $W_1$ of a low current two-wire line and remotely locates a short-circuit, also referred to as a line loop or low-resistance shunt, between the two line wires $W_1$, $W_2$ or for remotely locating a short-circuit between the wire $W_1$ and ground. Dipole 1 divides the two-wire line into two line sections $L_1$ and $L_2$. One end of the first line section $L_1$ is selectively connected to terminals 20 and 21 of a resistance measuring apparatus. The end of the second line section $L_2$ is connected to the terminals 30 and 31 of a load 3. The portions of wire $W_1$ respectively included in sections $L_1$ and $L_2$ are respectively connected to terminals 10 and 11 of dipole 1.

When the two-wire line is a telephone subscriber line, the measuring apparatus includes testing and measuring means selectively connected to the associated switching facility at the telephone exchange serving the subscriber line; the terminals 20 and 21 are connected to the terminals of the testing and measuring means during an in-line fault locating procedure for locating faults such as short-circuits. Load 3 includes a telephone subscriber installation, a private automatic branch exchange (P.A.B.X.) or another analogous telephone terminal.

Under these conditions, the first low-current range $I<I_T$, includes the values of the current flowing through a normally operating telephone line, such as during a telephone call or a telephone communication. Because I is in the first current range, the resistance of dipole 1 is close to zero whereby the presence of dipole 1 does not disturb the normal line operations.

In response to the resistance measured at terminals 20 and 21 of the testing and measuring means being detected as being considerably lower than that normally recorded for a voltage $V_1$ corresponding to a current in the first range, a voltage $V_2$ greater than the threshold voltage $V_T$ corresponding to the threshold current $I_T$ is fed to terminals 20 and 21 for the purpose of locating the short-circuit.

If the resistance measured at terminals 20 and 21 in response to the voltage $V_2$ being applied to these terminals remains practically constant, there is an implication that the dipole $D_1$ has not disturbed the measurements, and that a short circuit lies in the first line section $L_1$. However, if the measured resistance value seen at terminals 20 and 21 is markedly modified in response to application of $V_2$ to the terminals, which is due to resistor 14 becoming series-connected with the operate coil of relay 12 following the opening of contact 13 by activation of the relays, the first line section $L_1$ is not open and a short-circuit exists in the second line section $L_2$ or in the load 3.

As a corollary to the foregoing, short-circuit location may also be carried out in terms of current delayed-variation detection by applying a constant voltage $V_2$ to terminals 20 and 21; voltage $V_2$ is higher than the voltage $V_T$, as shown in FIG. 3. If the detected current varies with a determined delay, an indication is provided that the current has flowed through dipole 1, that the dipole has changed condition and that the short-circuit lies in the second section $L_2$ or in the load 3.

Since the threshold current is low and the coil resistance must be as small as possible, the series-combination formed by the contact 13 and the operate coil of relay 12 can be a flexible-blade relay (reed relay) or a mercury wet-blade relay with a resting contact in each case, or an inverter with a resting part that only would be used and would form the resting contact. It will be recalled that such relays include a miniature glass bulb only a few centimeters long and a few millimeters in diameter. Electrical conductors at the ends of the bulb carry ferromagnetic blades that are inside of the bulb and form contact 13. The bulb may contain either a vacuum or an inert gas. Coil 12 is wound around the inside of the bulb. When the bulb comprises a permanent magnet for the resting contact, the polarity of coil 12 must be defined. In FIG. 1 for instance, the positive terminal (+) is on the measuring apparatus terminal 20 side and the negative terminal (−) is on the load terminal 30 side. The current must therefore flow in the line from terminal 20 towards terminal 21. The inverter makes it possible in certain cases to do away with the need to have to test devices responsive to different polarities.

To solve this bias requirement, the test device $D_2$ according to another embodiment, illustrated in FIG. 4, comprises the dipole 1 and another dipole 4; dipole 4 is identical to dipole 1 but is oppositely poled and connected in parallel with respect thereto. Diodes 17 and 47 are added to the inputs of dipoles 1 and 4 respectively and are oppositely poled so dipole 1 is responsive only to positive current flowing from line segment $L_1$ to segment $L_2$ and vice versa for dipole 4. Second dipole 4 further comprises the relay 42 having an operate coil which is series connected with a resting contact 43 between the terminals 10 and 11. Connected in parallel with contact 43 is resistor 44. The coil 12 of the dipole 1 and the coil 42 of the dipole 4 are opposite poled, an effect caused by the magnetic opposite polarities of the permanent magnets that certain flexible-blade switches contain.

Diodes 17 and 47 are connected at the inputs of dipoles 1 and 4 to control the direction of current toward one or the other of the dipoles. In dipoles 1 and 4, the anodes of diodes 17 and 47 are respectively connected to terminals 10 and 11, while the cathodes of diodes 17 and 47 are respectively connected to the terminals of resting contacts 13 and 43 and the resistors 14 and 44.

Other types of relays may be employed, notably unbiased relays. The use of flexible-blade switches is preferred, particularly because they have small sizes, low cost, low energy consumption, and pulse-induced excitation possibility, as seen for the uses described hereinafter. Should the line be a telephone subscriber line, the change condition occurs for $V_T = 10$ volts and $I_T = 100$ mA. Each of coils 12 and 42 of dipoles 1 and 4 has an ohmic value of around 1 ohm, approximately 100 turns and a wire diameter of some 0.3 mm. The flexible-blade switch is 2 cm in length and 1 cm in diameter. Each of resistors 14 and 44 of dipoles 1 and 4 is about 100 ohms.

The current sensing test device $D_1$ or $D_2$ can also comprise a capacitor 15 which is connected in parallel between terminals 10 and 11 of dipole 1 in FIG. 1 or dipoles 1 and 4 in FIG. 4. Capacitors 15 enable the device to be transparent to alternating or impulsing currents, i.e. independent of the direction of the applied current.

A second capacitive means may be substituted for or added to the first capacitive means 15. The second capacitive means is a capacitor 16 that is parallel-connected with coil 12 of dipole 1 in FIG. 1. The second capacitive means can be also formed by a second capacitor connected in parallel with the coil 12 of dipole 1, and by a third capacitor 16 connected in parallel with coil 42 of dipole 4, as illustrated in FIG. 4. Capacitor 16 or capacitors 16 and 46 fulfill substantially the same role as capacitor 15.

As depicted in FIG. 5, the current sensing test device may further comprise two analogous elementary test devices, such as $D_1$ shown in FIG. 1 or $D_2$ in FIG. 4, that are connected in series on the line wires $W_1$ and $W_2$ respectively. When the test device comprises two biased elementary devices 1, the elementary devices are biased in the same current direction. Such a setup enable short-circuits to be located between the other wire $W_2$ and ground.

According to a further aspect of the invention, several current sensing test devices $5_1$ to $5_N$ can be connected in series on one or both line wires $W_1$ and $W_2$ at various predetermined locations along the line between terminals 20, 21 and load 3, as illustrated in FIG. 6. In the test system of FIG. 6, each test device $5_n$ where $1 \leq n \leq N$, is characterised by a predetermined voltage and current couple $(V_T, I_T)_n$ that is peculiar to it and different from the couples ascribed to the other test devices $5_1$ to $5_{n-1}$ and $5_{n+1}$ to $5_N$. The $(V_T, I_T)_1$ to $(V_T, I_T)_N$ couple values increase as distance increases from terminals 20 and 21 toward load 3. In this manner, several direct measuring voltages higher than threshold voltages $(V_T)_1$ to $(V_T)_N$, peculiar to test devices $5_1$ to $5_N$ connected in the two-wire line respectively and, are applied to terminals 20 and 21 for locating a short-circuit in the line. For example, when an applied measuring voltage lies between the two values $(V_T)_1$ and $(V_T)_2$ which are ascribed to the first two test devices $5_1$ and $5_2$ on the terminal 20 and 21 side, and when the measured line resistance has increased, an indication is provided that the short-circuit is located beyond first test device $5_1$, i.e. between the device $5_1$ and load 3. Constant voltages $(V_T)_2$ to $(V_T)_N$ are applied successively to terminals 20 and 21 until such time as the measured resistance no longer varies: in this case, the test device $5_n$ corresponding to the last applied measuring voltage lying between $(V_T)_n$ and $(V_T)_{n+1}$ does not disturb the line and the short-circuit is located between the test device $5_n$ and the preceding test device $5_{n-1}$.

Figure 7:
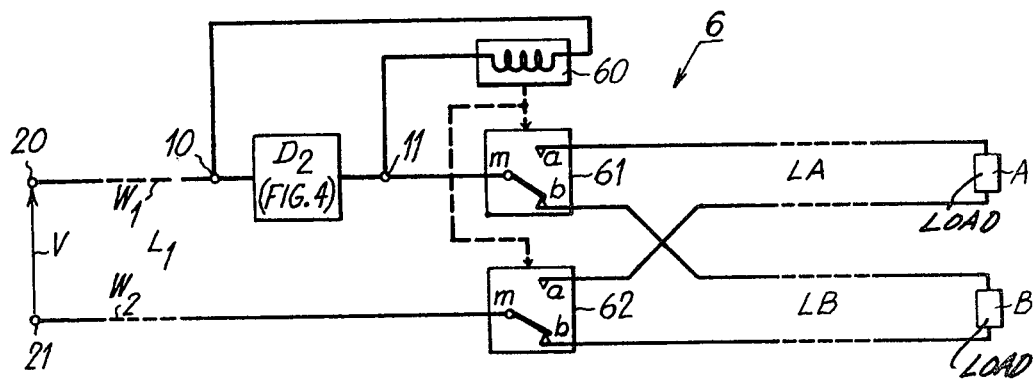
FIG. 7 is a circuit diagram of a switching device for selectively connecting one of two remote loads to a two-wire line as per the invention.
Figure 8:
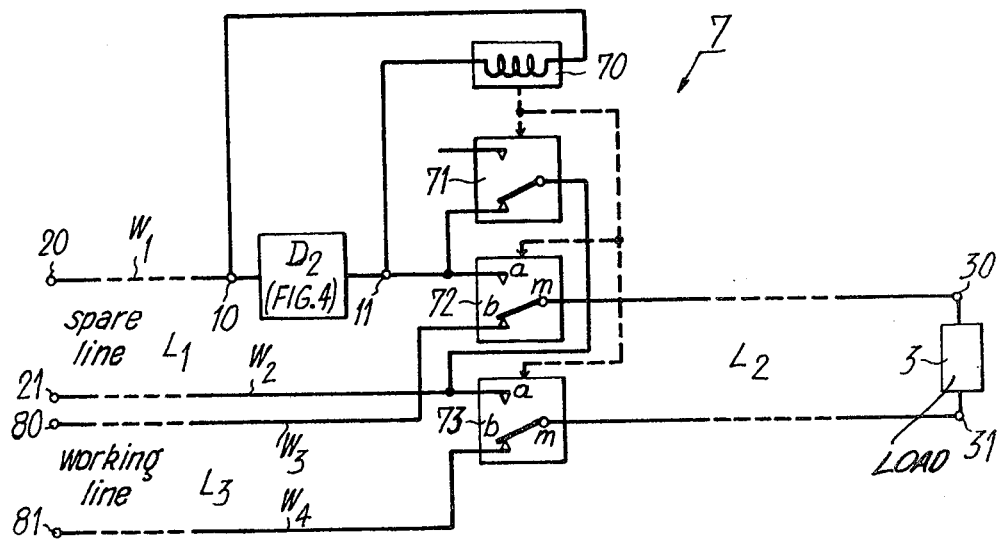
FIG. 8 is a circuit diagram of a switching device for switching a first two-wire line looped across a load with a second two-wire line as per the invention.

In FIGS. 7 and 8 are illustrated two particular uses of the test device, preferably device $D_2$ as illustrated in FIG. 4.

In FIG. 7, switching device 6 is remotely monitored by positive and negative pulses which are fed to line terminals 20 and 21 for selecting one of two remote loads A and B. The switching device 6 comprises the test device $D_2$, series connected on the wire $W_1$ of the line $L_1$, and the operate coil of a bistable relay 60, connected in parallel with terminals 10 and 11 of the test device $D_2$ on the wire $W_1$. Two switch means 61 and 62 have two stationary contacts with no intermediate position of the movable contact and are included in the switching device 6. Movable contacts $61m$ and $62m$ of switches 61 and 62 are simultaneously controlled by bistable relay 60.

A stationary contact $61a$ of the switch means 61 and a stationary contact $62a$ of the switch means 62 are connected to opposite terminals of the load A respectively, possibly via a two-wire line LA. The other stationary contact $61b$ of the switch means 61 and the other stationary contact $62b$ of the switching means 62 are connected to opposite terminals of the second load B respectively, possibly via a second two-wire line LB. The movable contact $61m$ of switch means 61 is connected to the terminal 11 of test device $D_2$ whereas the movable contact $62m$ of switch means 62 is connected to remote terminal 21 via the line wire $W_2$.

A positive voltage applied to test device terminals 10, 11 and corresponding to a current greater than $I_T$ controls the switch-over in bistable relay 60.

When a positive pulse is applied between line terminals 20 and 21 of FIG. 7, the contact 13 of the respective dipole 1 in test device $D_2$ opens and the bistable relay 60 is activated to cause the movable contacts $61m$ and $62m$ of switch means 61 and 62 to move out of engagement with stationary contacts $61a$ and $61b$ and to move to a second position into engagement with the other stationary contacts 61b and 62b, wherein whereby the line $L_1$ is terminated with the load B via the line LB as shown in FIG. 7. When the positive pulse has been completed, the dipole 1 of the device $D_2$ reverts to the rest position and the link from line $L_1$ to line LB remains established. To revert to the original condition, a negative pulse is applied across terminals 20 and 21. The negative pulses causes contact 43 of the respective dipole 4 in the test device $D_2$ to open and causes the movable contacts 61m and 62m of switch means 61 and 62 to move to the original position into engagement with the stationary contacts 61a and 62a whereby the line $L_1$ is terminated with the load A via the line LA.

Because of decoupling capacitors 15 and/or capacitors 16 and 46, bistable relay 60 does not fall back during switching from one load A or B to the other B or A, i.e. upon line opening caused by displacing moving contacts 61m, 62m.

The switching device 7 illustrated in FIG. 8 switches a first or working two-wire line $L_3$–$L_2$ that is looped across a load 3, to a second or spare two-wire line $L_1$. Switching occurs, for example, in response to a fault in the working line detected by detector $D_2$ selectively connected between terminals 80 and 81 of the working section $L_3$ and the terminals 20 and 21 of spare line $L_1$ that respond to voltages from a testing and measuring means. Switching device 7 is located at a remote point which is between terminals 20 and 21 and the common load 3 where the lines $L_1$ and $L_3$ can be connected to each other. It can be seen in FIG. 8 that the test device $D_2$ as shown in FIGS. 1 and 4 is connected in series on the wire $W_1$ of the spare line $L_1$.

The switching device 7 comprises a bistable relay having an operate coil 70 connected in parallel between the terminals 10 and 11 of the test device $D_2$. The bistable relay controls three switch means 71, 72 and 73. The first switch means 71 is analogous to an open or resting contact that is connected between the terminal 11 of the device $D_2$ and the wire $W_2$ of the spare line section $L_1$, i.e. between the ends of the wires of the line section $L_1$. When desactived, switch means 71 is closed to loop the spare line $L_1$ via a small conductive link, or other load if necessary.

The second and third switch means 72 and 73 are switches each having two stationary contacts and a movable contact without an intermediate position. Movable contacts 72m and 73m are normally connected to the terminals 30, 31 of the load 3 through the working line section $L_2$. First stationary contacts 72a and 73a of switch means 72 and 73 are connected to terminal 11 at the end of the wire $W_1$ and to the end of the wire $W_2$ of the spare line section $L_1$ respectively. The connection from contact 73a to terminal 116 via normally closed contacts of switch 71 is the same as the connection of contact 72a to the end of wire $W_2$. The two other stationary contacts 72b and 73b of switch means 72 and 73 are connected to the ends of the wires $W_3$ and $W_4$ of the working line section $L_3$. In normal operations, the wire $W_3$ is connected to terminal 30 of load 3 via contacts 72b and 72m, and the wire $W_4$ is connected to terminal 31 of the load 3 via contacts 73b and 73m, as shown in FIG. 8.

The operating principle is analogous to that of switching device 6 in FIG. 7. To detect a fault in the working line, or to be more exact in the line section $L_3$, a positive pulse is applied to spare line terminals 20 and 21, activate the bistable relay 70 to simultaneously change the condition of switch means 71, 72 and 73. If a fault exists the working line section $L_3$ is opened by disengagement of moving contacts 72m and 73m with respect to stationary contacts 72b and 73b; the moving contacts 72m and 73m engage the other stationary contacts 72a and 73a wherein the spare line section $L_1$ is terminated with the load 3 via the line $L_2$. At one and the same time, switch 71 opens to interrupt the small conductive link between the spare line section wires $W_1$ and $W_2$.

Once the fault in the working line section $L_3$ has been eliminated, a negative pulse is applied to spare line terminals 20 and 21 and causes the movable contacts of the switch means 71, 72 and 73 to return to their original position, as depicted in FIG. 8.

What we claim is:

1. A test device for locating faults in a two-wire line comprising a first dipole connected in series on one of the line wires, the first dipole including: means for inserting a constant ohmic value in series with said one line wire when the current flowing from the one line wire through the dipole is less than a predetermined value, and means for increasing the ohmic value inserted in series with said one line wire sharply to a higher value in a high-current range when the current flowing from the one line wire through the dipole is greater than said predetermined current value.

2. A test device as claimed in claim 1 comprising a shunt circuit for the dipole, the shunt circuit including capacitive impedance means having a value so that alternating currents on the one line wire bypass the first dipole.

3. A test device as claimed in claim 1 wherein said first dipole comprises a relay having an operate coil and a resting contact, said operate coil and resting contact being connected in series with each other and terminals of said first dipole on said one line wire, and a resistor connected in parallel with said contact.

4. A test device as claimed in claim 3 wherein said first dipole comprises a capacitive means connected in parallel with said relay coil.

5. A test device as claimed in claim 3 wherein said relay is biased.

6. A test device as claimed in claim 3 wherein said contact includes a resting part of an inverter.

7. A test device as claimed in claim 6 wherein said relay is not biased.

8. A test device as claimed in claim 3 wherein said relay includes a flexible blade switch.

9. A test device as claimed in claim 5 comprising a second dipole identical to said first dipole, the second dipole having a relay coil oppositely-poled to said relay coil of said first dipole, each of said first and second dipoles comprising a diode connected in series with a series circuit formed by the contact and the relay coil of the dipole and which is oppositely-poled to the diode of the other dipole.

10. A test device as claimed in claim 1 comprising another analogous test device connected in series on the other line wire.

11. A test system for locating faults in a two-wire line comprising a plurality of test devices, each of the test devices being connected at a different predetermined location along the line, each of the test devices being a first dipole connected in series on one of the line wires, the first dipole including: means for inserting a constant ohmic value in series with said one line wire when the current flowing from the one line wire through the dipole is less than a predetermined value, and means for increasing the ohmic value inserted in series with said one line wire sharply to a higher value in a high-current range when the current flowing from the one line wire through the dipole is greater than said predetermined current value; the test devices at the difference locations having different predetermined current values.

12. A test device as claimed in claim 11 wherein each of said first dipole comprising a relay having an operate coil and a resting contact, said operate coil and resting contact being connected in series with each other and terminals of said first dipole on said one line wire, and a resistor connected in parallel with said contact.

13. A switching device for selectively connecting one of two remote loads to a two-wire line having first and second wires, said switching device comprising:
 a test device connected in series on one of the line wires, the test device having a constant ohmic value when the current supplied by the one line wire to the test device is less than a predetermined value, the ohmic value increasing sharply to a higher value in a high-current range when the current supplied by the one line wire to the test device is greater than said predetermined value,
 a bistable relay having an operate coil connected in parallel between terminals of said test device to be responsive to the voltage across the test device, and
 first and second switch means respectively connected in series with the first and second line wires and controlled by said bistable relay, each of said switch means having a first stationary contact connected to one terminal of one of the said loads and another stationary contact connected to a terminal of the other load.

14. A switching device as claimed in claim 13 wherein said test device comprises two substantially identical dipoles, each of said dipoles comprising:
 a relay having an operate coil oppositely-poled to said relay coil of the other dipole,
 a resting contact connected in series with said coil between terminals of said dipole on said line wire,
 a resistor connected in parallel with said contact, and
 a diode connected in series with a series circuit formed by said contact and said relay coil of said dipole and being oppositely poled to the diode of said other dipole.

15. A switching device for switching a first two-wire line looped across a load with a second two-wire line, said switching device comprising:
 a test device connected in series with one of the wires of said second line, the test device having a constant ohmic value in a low-current range when the current supplied by the one wire to the test device is less than a predetermined current value, the ohmic value increasing sharply to a higher ohmic value in a high-current range when the current supplied by the one wire to the test device is greater than said predetermined current value,
 a bistable relay having an operate coil connected across terminals of said test device connected in series with said one line so as to be responsive to the voltage across said test device,
 a first switch means controlled by said bistable relay and connected between ends of the wires of said second line, a second switch means controlled by said bistable relay and having first and second stationary contacts respectively connected to an end of one wire of said first line and an end of one wire of said second line, the second switch means having a movable contact connected to a terminal of said load, and a third switch means controlled by said bistable relay and having third and fourth stationary contacts respectively connected to ends of the other wires of said first and second lines and a movable contact connected to the other terminal of said load.

16. A switching device as claimed in claim 15 wherein said test device comprises two identical dipoles, each of said dipoles comprising:
 a relay having an operate coil oppositely-poled to said relay coil of the other dipole,
 a resting contact connected in series with said coil between the terminals of said dipole on said line wire,
 a resistor connected in parallel with said contact, and
 a dipole connected in series with a series circuit formed by said contact and said relay coil of said dipole and being oppositely-poled to the diode of said other dipole.

17. A method of detecting the location of a low impedance fault, such as a short circuit, on a line having a transmission wire between first and second terminals and a return path back to the location of the first terminal from a load connected to the second terminal, comprising the steps of
 (a) connecting a dipole in series with the wire at a location between the first and second terminals, the dipole having a constant ohmic value in response to current in a low range less than a predetermined value flowing from the wire through it and a sharply higher ohmic value in response to current flowing from the wire through it having a value greater than the predetermined value,
 (b) thereafter applying a first voltage to the first terminal relative to the return path, the first voltage having a value that produces a current in the wire and the dipole that causes a normal resistance to be reflected between the first terminal and the return path if there is no fault on the line,
 (c) measuring the resistance between the first terminal and the return path while the first voltage is applied to the first terminal, whereby in response to the resistance measured during step (c) being less than the normal resistance an indication is provided that there is a line fault,
 (d) in response to the resistance measured during step (c) being less than the normal resistance applying a second voltage to the first terminal relative to the return path, the second voltage being greater than the first voltage and being sufficiently great as to supply current greater than the predetermined value to the dipole if there is no line fault between the first terminal and the dipole, and
 (e) measuring a response at the first terminal while the second voltage is applied to the first terminal, whereby indications are provided that the line fault subsists between the first terminal and the dipole, and between the dipole and the second terminal when the response measured during step (e) respectively remains substantially constant and changes considerably.

18. The method of claim 17 wherein the response measured during step (e) is resistance, whereby the resistance measured during step (e) remains substantially constant at and changes considerably beyond the value measured during step (c) in response to the fault subsisting between the first terminal and the dipole and between the dipole and the second terminal, respectively.

19. The method of claim 17 wherein the response measured during step (e) is current, whereby the current measured during step (e) remains substantially constant at the value it has when the second voltage is initially applied and throughout the interval while the second voltage is applied to the first terminal when the fault is between the first terminal and the dipole, and the current measured during step (e) decreases considerably from the value it has when the second voltage is initially applied to a lower value while the second voltage is applied to the first terminal when the fault is between the dipole and second terminal.

20. In combination, an electric transmission line having a first wire having first and second remote terminals and a return path back to the location of the first terminal from the location of the second terminal, a dipole connected in series with the wire at a location between the first and second terminals, the dipole including elements causing the dipole to insert a constant ohmic value in series with the wire in response to current in a low range less than a predetermined value flowing from the wire through it and to insert a sharply higher ohmic value in series with the wire in response to current flowing from the wire through it having a value greater than the predetermined value.

21. The combination of claim 20 wherein the dipole includes: third and fourth terminals connected in series with the line, impedance means normally having a low value, a current responsive controller for the impedance means, the impedance means and controller being connected in series with the switch means, the controller responding to current flowing through it and the third and fourth terminals so that the impedance means has low and high impedances in response to the current flowing through the controller being respectively less than and greater than the predetermined value.

22. The combination of claim 21 wherein the impedance means comprises switch means activated to the closed and open states to achieve the low and high impedance.

23. The combination of claim 20 wherein the return path includes a second wire having third and fourth terminals respectively at the locations of the first and second terminals, a second dipole connected in series with the second wire at a location between the third and fourth terminals, the second dipole including elements causing the second dipole to insert a constant ohmic value in series with the second wire in response to current in a low range less than a pedetermined value flowing from the wire through it and to insert a sharply higher ohmic value in series with the second wire in response to current flowing from the wire through it having a value greater than the predetermined value.

24. The combination of claim 20 further including first and second lines respectively having third and fourth wires, the third and fourth wires respectively including third and fourth terminals at the same location as the second terminal, means responsive to a voltage developed across the dipole for controlling connections between the second and third terminals and between the second and fourth terminals so that the second and third terminals are connected together to the exclusion of the second and fourth terminals and the second and fourth terminals are connected together to the exclusion of the second and third terminals.

* * * * *